United States Patent
Co et al.

(10) Patent No.: US 7,642,105 B2
(45) Date of Patent: Jan. 5, 2010

(54) MANUFACTURING METHOD FOR PARTIALLY-GOOD MEMORY MODULES WITH DEFECT TABLE IN EEPROM

(75) Inventors: Ramon S. Co, Trabuco Canyon, CA (US); Mike Chen, Newport Coast, CA (US); David Sun, Irvine, CA (US)

(73) Assignee: Kingston Technology Corp., Fountain Valley, CA (US)

( * ) Notice: Subject to any disclaimer, the term of this patent is extended or adjusted under 35 U.S.C. 154(b) by 270 days.

(21) Appl. No.: 11/944,551

(22) Filed: Nov. 23, 2007

(65) Prior Publication Data

US 2009/0137070 A1 May 28, 2009

(51) Int. Cl.
*H01L 21/66* (2006.01)
*G01R 31/26* (2006.01)
*G11C 29/00* (2006.01)

(52) U.S. Cl. ................... 438/17; 365/200; 257/E25.011
(58) Field of Classification Search .................... 438/17; 365/200, 201; 257/E23.079, E25.011, E25.023
See application file for complete search history.

(56) References Cited

U.S. PATENT DOCUMENTS

| | | | |
|---|---|---|---|
| 4,527,251 A * | 7/1985 | Nibby et al. ................... | 714/8 |
| 5,315,552 A | 5/1994 | Yoneda | |
| 5,539,697 A | 7/1996 | Kim et al. | |
| 5,758,056 A | 5/1998 | Barr | |
| 6,052,798 A | 4/2000 | Jeddeloh | |
| 6,119,049 A | 9/2000 | Peddle | |
| 7,269,765 B1 * | 9/2007 | Charlton et al. ............. | 714/710 |
| 7,277,337 B1 | 10/2007 | Co et al. | |
| 7,473,568 B2 * | 1/2009 | Co et al. ....................... | 438/18 |
| 2004/0088614 A1 | 5/2004 | Wu | |
| 2006/0221733 A1 | 10/2006 | Yang | |
| 2007/0174718 A1 | 7/2007 | Fouquet-Lapar | |
| 2007/0269911 A1 * | 11/2007 | Co et al. ....................... | 438/17 |
| 2007/0288805 A1 * | 12/2007 | Charlton et al. ............. | 714/710 |
| 2008/0153394 A1 * | 6/2008 | Gutierrez et al. ............. | 451/37 |
| 2008/0163032 A1 * | 7/2008 | Lastras-Montano ......... | 714/785 |
| 2008/0163095 A1 * | 7/2008 | Pannese et al. .............. | 715/772 |
| 2008/0163096 A1 * | 7/2008 | Pannese et al. .............. | 715/772 |
| 2009/0137070 A1 * | 5/2009 | Co et al. ....................... | 438/17 |

* cited by examiner

*Primary Examiner*—Walter L Lindsay, Jr.
(74) *Attorney, Agent, or Firm*—Stuart T. Auvinen; gPatent LLC (57) ABSTRACT

A manufacturing method makes memory modules from partially-good DRAM chips soldered to its substrate. The partially-good DRAM chips have a number of defective memory cells that is below a test threshold, such as 10%. Packaged DRAM chips are optionally pre-screened and considered to pass when the number of defects found is less than the test threshold. A defect table is created during testing and written to a serial-presence-detect electrically-erasable read-only memory (SPD-EEPROM) on the memory module. The memory module is finally tested on a target-system tester that reads the defect table during booting, and redirects memory access to defective memory locations identified by the defect table. The memory modules may be burned in or tested at various temperatures and voltages to increase reliability.

20 Claims, 10 Drawing Sheets

PRIOR ART

FRONT SIDE

BAD BLKS:
    4301XXX
    7100XXX      FIG. 6A
    B8FFXXX

BLK MAP:

|   | 0 | 1 | 2 | 3 | 4 | 5 | 6 | 7 | 8 | 9 | A |
|---|---|---|---|---|---|---|---|---|---|---|---|
| 0 | 1 | 1 | 1 | 0 | 1 | 1 | 1 | 1 | 1 | 1 | 1 |
| 1 | 1 | 1 | 1 | 1 | 1 | 1 | 1 | 1 | 1 | 0 | 1 |
| 2 | 1 | 1 | 1 | 1 | 1 | 1 | 1 | 1 | 1 | 1 | 1 |
| 3 | 0 | 1 | 1 | 1 | 1 | 1 | 1 | 1 | 1 | 1 | 1 |
| 4 | 1 | 1 | 1 | 1 | 1 | 1 | 1 | 1 | 1 | 1 | 1 |
| 5 | 1 | 1 | 1 | 1 | 1 | 1 | 1 | 0 | 0 | 0 | 0 |

MANUFACTURING METHOD FOR PARTIALLY-GOOD MEMORY MODULES WITH DEFECT TABLE IN EEPROM

RELATED APPLICATIONS

This application may be related to U.S. Ser. Nos. 11/308, 869, 11/309,297, 11/309,298, and U.S. Pat. No. 7,277,337, having a common assignee and at least one inventor in common, but presenting patentably distinct claims.

FIELD OF THE INVENTION

This invention relates to memory-module manufacturing, and more particularly to making memory modules using partially-good memory chips.

BACKGROUND OF THE INVENTION

Memory modules are widely used in a variety of electronic systems, especially Personal Computers (PC's). Memory modules are built to meet specifications set by industry standards, thus ensuring a wide potential market. High-volume production and competition have driven module costs down dramatically, benefiting buyers of a wide variety of electronic systems.

Memory modules are made in many different sizes and capacities, such as older 30-pin and 72-pin single-inline memory modules (SIMMs) and newer 168-pin, 184-pin, and 240-pin dual inline memory modules (DIMMs). The "pins" were originally pins extending from the module's edge, but now most modules are leadless, having metal contact pads or leads. The modules are small in size, being about 3-5 inches long and about an inch to an inch and a half in height.

The modules contain a small printed-circuit board substrate, typically a multi-layer board with alternating laminated layers of fiberglass insulation and foil or metal interconnect layers. Surface mounted components such as DRAM chips and capacitors are soldered onto one or both surfaces of the substrate.

Figure 1:
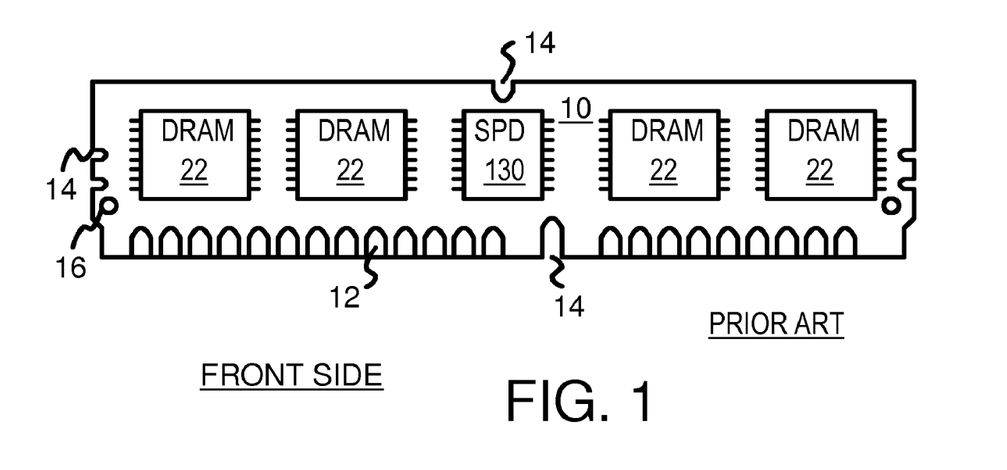
FIG. 1 shows an illustration of a fully-buffered memory module.

FIG. 1 shows an illustration of a fully-buffered memory module. Memory module 10 contains a substrate such as a multi-layer printed-circuit board (PCB) with surface-mounted DRAM chips 22 mounted to the front surface or side of the substrate, as shown in FIG. 1, while more DRAM chips 22 are mounted to the back side or surface of the substrate (not shown). Memory module 10 could be a fully-buffered dual-inline memory module (FB-DIMM) that is fully buffered by an Advanced Memory Buffer (AMB) chip (not shown) on memory module 10. The AMB chip uses differential signaling and packets to transfer data at high rates.

Memory modules without an AMB chip are still being made. Such unbuffered memory modules carry address, data, and control signals across metal contact pads 12 from the motherboard directly to DRAM chips 22. Some memory modules use simple buffers that buffer or latch some of these signals but do not use the more complex serial-packet interface of a FB-DIMM.

Metal contact pads 12 are positioned along the bottom edge of the module on both front and back surfaces. Metal contact pads 12 mate with pads on a module socket to electrically connect the module to a PC's motherboard. Holes 16 are present on some kinds of modules to ensure that the module is correctly positioned in the socket. Notches 14 also ensure correct insertion of the module. Capacitors or other discrete components are surface-mounted on the substrate to filter noise from the DRAM chips 22.

Some memory modules include a serial-presence-detect electrically-erasable programmable read-only memory (SPD-EEPROM) on the memory module substrate. SPD-EEPROM 130 stores configuration information for the memory module, such as speed, depth, and arrangement of the memory on the memory module.

DRAM chips may have a very large capacity, such as 512 Mbits, or half a giga-bit. The large number of memory cells, small size of individual memory cells, and overall large area of the DRAM die cause manufacturing defects to be somewhat common. DRAM chips are tested on a wafer before being separated and packaged, but this wafer-sort test may not catch all defects. A probe card is used to make contact with individual die on the wafer, causing a very noisy test environment. Thus test speeds are limited at wafer sort, preventing more exhaustive testing that could catch more defects.

Thus some packaged DRAM chips are going to contain defects. Further testing of packaged DRAM chips may be performed cost-effectively at higher speeds, allowing defective DRAM chips to be identified and discarded. However, discarding packaged DRAM chips is somewhat wasteful, since often only a single defect is present. For example, a defect may cause only 1 of the half-billion memory cells to fail. Nearly half a billion memory cells operate properly on a DRAM chip having a single defect, yet this chip is typically discarded.

Some DRAM chips are repairable. A fuse on the die may be blown using a laser during wafer sort, or some other method may be used. This repair may be attempted and performed to determine which DRAM chips are good and which are bad, or repair may be a separate step. Repair often causes the full size of memory to be available when repair is successful. For example, repairing a bad memory cell on a 512 Mbit DRAM allows a full 512 Mbits to be usable, since the bad memory cell is replaced by a redundant memory cell during repair.

Rather than repairing chips, some chip manufacturers may downgrade DRAM chips to lower capacities. For example, a 1 giga-bit DRAM die with a defect may be partially-good, packaged, and sold as a half giga-bit DRAM.

Manufacturers of memory modules may purchase packaged DRAMs that have a variety of levels of testing already performed. Cost may be reduced by purchasing packaged DRAMs that have not yet been exhaustively tested. The memory module manufacturer may arrange to more fully test these incoming DRAM chips to weed out DRAM chips with single defects.

Figure 2A:
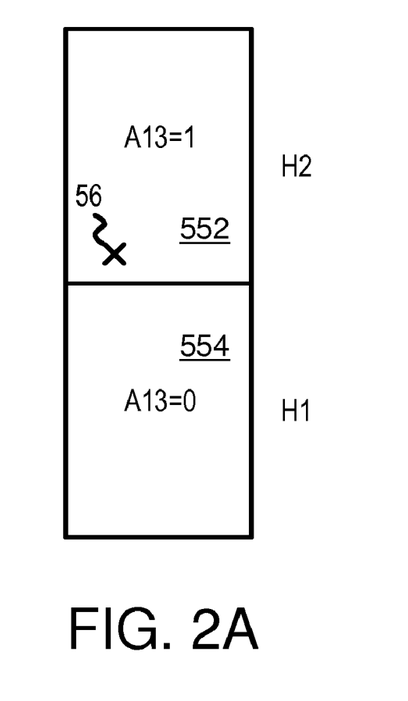
FIGS. 2A-B show a defect on a partially-good DRAM chip.

FIGS. 2A-B show a defect on a partially-good DRAM chip. In FIG. 2A, DRAM chip has an upper address bit A13 that divides the memory into two halves H1, H2. The halves H1, H2 may be logical halves rather than separate physical arrays on the DRAM die. When address A13=1, half H2 is selected, while when A13=0, half H1 is selected. Defect 56 occurs when A13 is 1, so defect 56 is in H2 half 552. Since all bits with A13=0 are good, H1 half 554 is a good half and could be usable on a memory module.

Figure 2B:
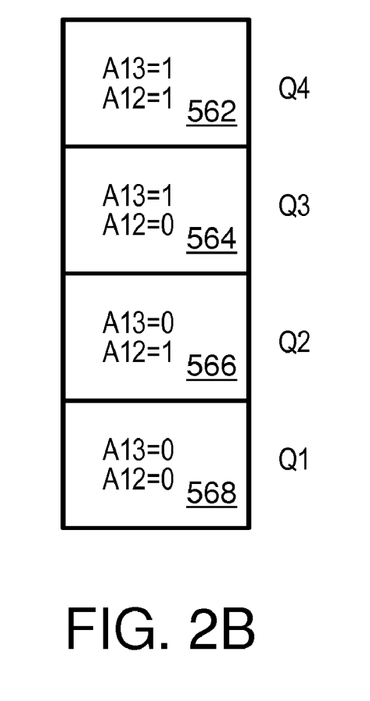

Sometimes two or more defects may occur. When defects occur in both halves 552, 554, there is no half that is usable. However, the DRAM chip can be further divided into quadrants. In FIG. 2B, upper address bits A13, A12 have four possible values, creating four quadrants 562, 564, 566, 568, also labeled Q4, Q3, Q2, Q1. For example, for memory cells addressable by A13=1 and A12=0, Q3 quadrant 564 is selected.

When defects occur in only two of the four quadrants, the remaining two quadrants may be combined to form a half-size DRAM. For example, when defects occur in Q3, Q2 quadrants 564, 566, the remaining Q4, Q1 quadrants 562, 568 may be used as a half-size memory.

Figure 3:
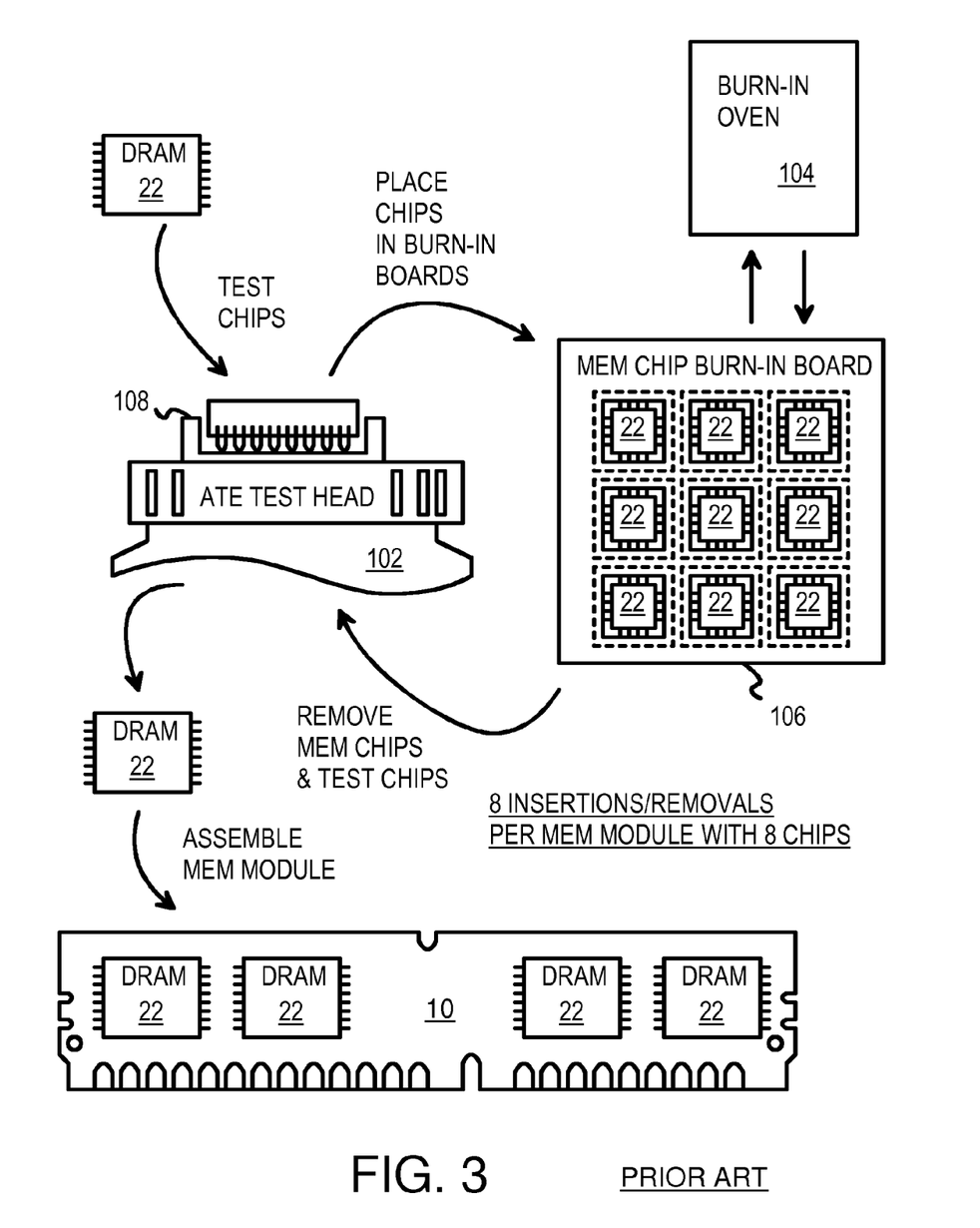
FIG. 3 illustrates a prior-art burn-in test flow for making memory modules.

FIG. 3 illustrates a prior-art burn-in test flow for making memory modules. DRAM dice are made in a factory or wafer fab and are tested and packaged as DRAM chips 22. Some wafer-sort testing may be performed to determine which die to package and which die to discard.

Packaged DRAM chips 22 are initially tested by being placed into test socket 108, which connects to ATE test head 102 of an automated-test-equipment (ATE). ATE testers are very expensive, typically being million-dollar machines. DRAM chips 22 that pass testing on ATE test head 102 are inserted into test sockets on memory-chip burn-in board 106. Once populated with many DRAM chips 22, memory-chip burn-in board 106 is inserted into burn-in oven 104 for several hours, days, or weeks of applied stress.

A stress voltage may be applied to the power-supply or other pins of DRAM chips 22 by memory-chip burn-in board 106 while inside burn-in oven 104. This allows DRAM chips 22 to be stressed by both high heat and high voltage, such as 125 degrees C. and 5.5 volts. Applied voltages to signal pins may be toggled high and low for added stress.

After a period of time in burn-in oven 104, memory-chip burn-in board 106 is removed from burn-in oven 104 and DRAM chips 22 are removed from test sockets on memory-chip burn-in board 106. DRAM chips 22 are then tested again on ATE test head 102, and failing chips are discarded. If the period of time in burn-in oven 104 is sufficiently long, failures known as infant mortalities can be screened out, increasing reliability of the remaining DRAM chips 22.

DRAM chips 22 that pass the post-burn-in test on ATE test head 102 are soldered to substrate boards during assembly of memory module 10. Memory modules may then be tested, either on ATE test head 102 or on another tester, and shipped to customers.

A single memory module may contain several DRAM chips, such as 8 or more DRAM chips per module. Each of these 8 or more DRAM chips 22 must be inserted into test sockets on memory-chip burn-in board 106 before insertion into burn-in oven 104, and each of the 8 or more DRAM chips 22 must be removed from these test sockets on memory-chip burn-in board 106 after removal from burn-in oven 104. Inserting and removing DRAM chips into test sockets on memory-chip burn-in board 106 may be performed manually, which is tedious and time consuming.

A disadvantage of this burn-in process is that each memory module with 8 DRAM chips requires 8 insertions and 8 removals, or a total of 16 insertion/removal steps per module with 8 DRAM chips. A human operator likely can only insert or remove one DRAM chip at a time.

What is desired is memory module that can be constructed with partially-good DRAM chips. A manufacturing and testing method to make memory modules from partially-good memory chips is desirable. A process to test partially-good DRAM chips, store defect maps, and use the partially-good chips on memory modules is desirable.

BRIEF DESCRIPTION OF THE DRAWINGS

FIG. 8 shows a flowchart of a simplified manufacturing process that uses partially-good DRAM chips without burn-in.

DETAILED DESCRIPTION

The present invention relates to an improvement in memory module manufacturing. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 4:
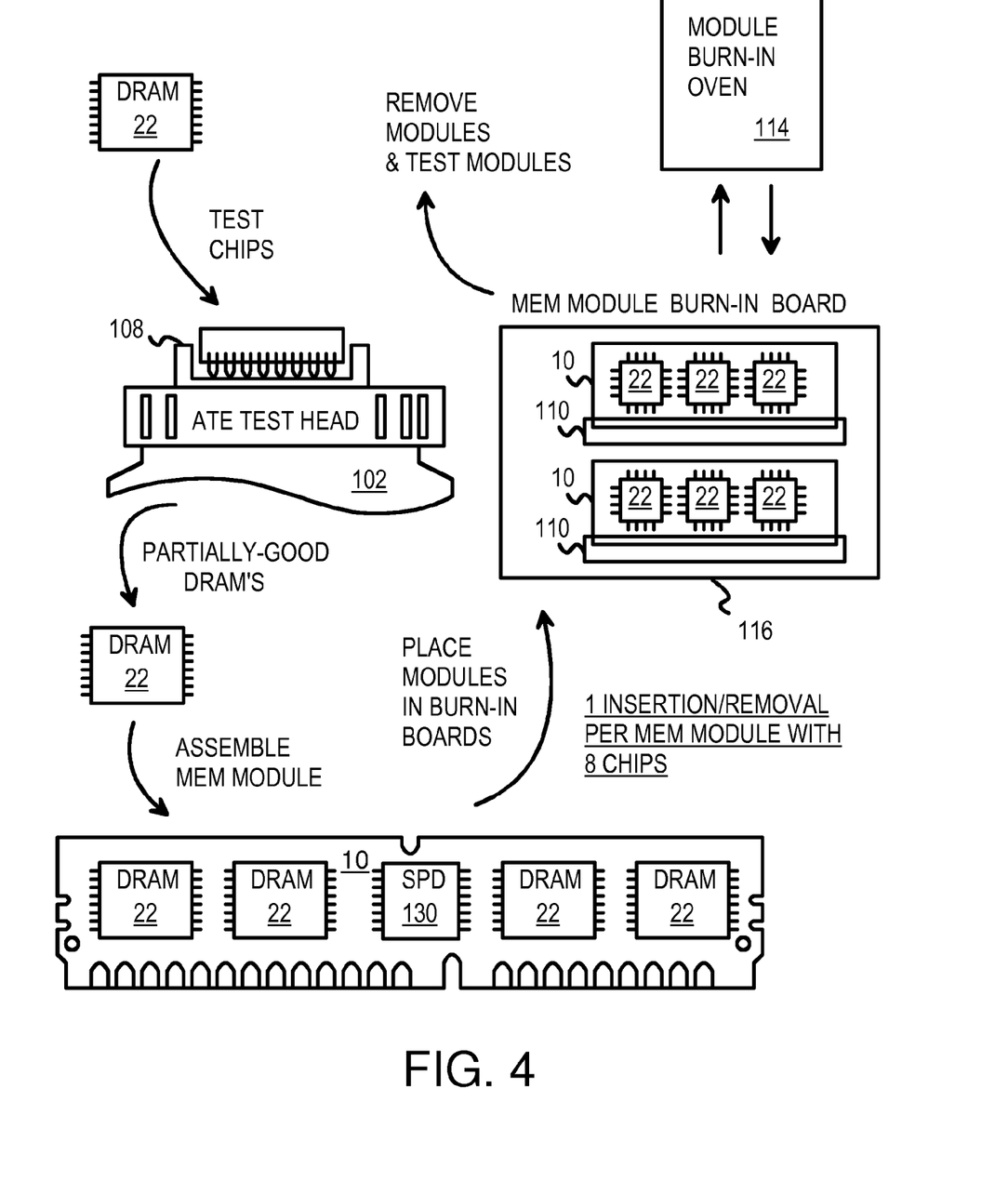
FIG. 4 highlights a test flow that burns in assembled memory modules rather than individual partially-good DRAM chips.

FIG. 4 highlights a test flow that burns in assembled memory modules rather than individual partially-good DRAM chips. Wafers of good and partially-good DRAM die are packaged into packages such as ball-grid-array (BGA) or thin-small-outline packages (TSOP) and delivered to the memory module manufacturer. The packaged partially-good DRAM chips are inserted into test socket 108 on ATE test head 102 and an initial test is performed. This initial test is limited so that the amount of time spent on ATE test head 102 for each DRAM chip is minimized, thus minimizing per-chip test costs. This initial test can include D.C. tests such as opens, shorts, power, and some limited functional tests. However, full functional tests with many test patterns may not performed at this stage.

DRAM chips that have fewer than 10% of the memory locations defective are considered to be partially-good DRAMs and pass the initial test, along with 100% good DRAM chips. The passing DRAM chips are soldered onto module substrates to build memory modules 10. These DRAM chips have not yet passed burn-in testing, and some may have almost 10% defective memory cells. Some infant mortalities may occur. However, when yields are high, such failures are small enough that the savings in test costs offsets any re-work costs. The locations of the defective memory cells are mapped out into a defect map that is programmed into a SPD-EEPROM on the memory module.

The assembled memory modules may be tested in a simple memory module tester that costs much less than ATE test head 102. The assembled memory modules are inserted into memory module sockets 110 on memory-module burn-in board 116. Memory-module burn-in board 116 is then inserted into burn-in oven 114, and the memory modules are heated and voltage-stressed.

After the burn-in time period, memory-module burn-in board 116 is removed from burn-in oven 114 and memory modules 10 are removed from memory-module burn-in board 116. Memory modules 10 are then extensively tested on a memory module tester. Functional test patterns that test all memory locations on all DRAM chips on the memory module are executed in this final test.

Since each memory module contains several DRAM chips, such as 8 DRAM chips, these 8 DRAM chips are simultaneously tested in parallel. This parallel testing reduces test time compared with running the same test patterns on individual DRAM chips inserted into ATE test head 102. Also, low-cost memory-module testers that are based on personal-computer motherboards may be used rather than million-dollar ATE machines. Thus test cost may be significantly reduced.

In this test flow, an entire memory module is inserted into memory module socket 110 on memory-module burn-in board 116. Only one insertion and one removal operation is required for burn-in. A memory module contains many DRAM chips, such as 8 DRAM chips. One insertion and removal allows 8 DRAM chips to be burned-in and tested together. In contrast, as shown in FIG. 3, the 8 individual DRAM chips require 8 insertions and 8 removals from memory-chip burn-in board 106.

Thus 7 insertion steps and 7 removal steps are eliminated using the flow of FIG. 4 rather than the flow of FIG. 2. This results in a significant savings in operator time and handling costs. Even if automated insertion/removal equipment were used, savings in equipments costs and usage time occur.

During the final functional testing, the locations of the defective memory cells are mapped out to create a defect map. The defect map is programmed into a SPD-EEPROM on the memory module. Then the memory module is re-tested on a target system that reads the defect map from the SPD-EEPROM and writes and reads the non-defective memory locations. Defective memory locations identified by the defect map are not tested but are skipped over or remapped to good memory locations.

Figure 5:
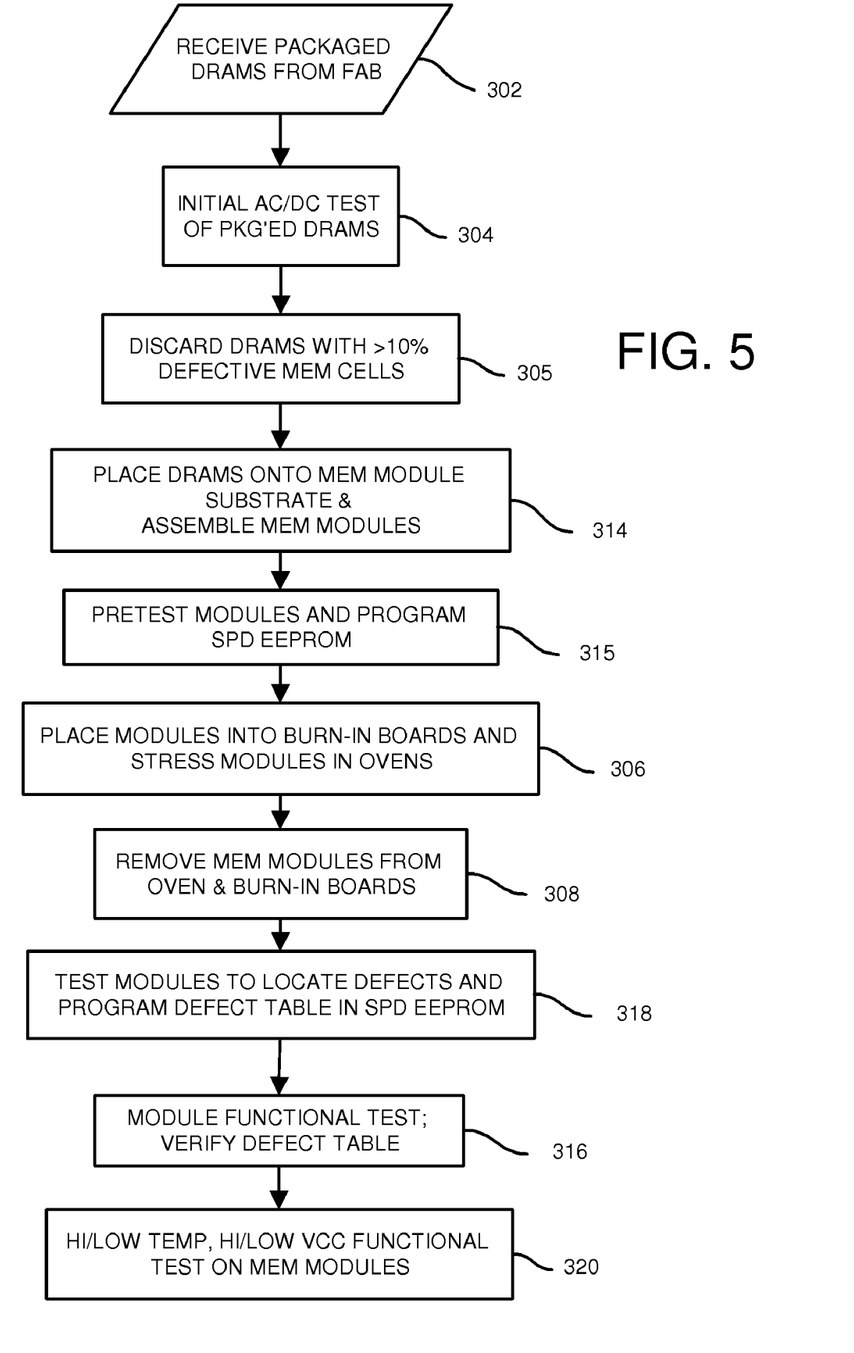
FIG. 5 shows a flowchart of a manufacturing process that uses partially-good DRAM chips.

FIG. 5 shows a flowchart of a manufacturing process that uses partially-good DRAM chips. Partially-good DRAM chips are received from a wafer fab or foundry, step 302. These partially-good DRAM chips may have been initially tested at the wafer fab by a wafer-sort machine to mark and discard grossly bad die, or may be blindly packaged. The packaged partially-good DRAM chips are tested by the memory module manufacturer or a contractor during an incoming AC/DC test, step 304. This incoming test includes DC tests such as opens, shorts, and power consumed, and also performs simple AC testing with a few test patterns.

In a typical AC test, the test is halted at the first failure. However, the AC test in step 304 continues when a defective memory location is found, and keeps a tally of the number of defective memory locations. Once the test pattern is done, the number of defective memory locations is compared to a test threshold, such as 10%. When the number of defective memory locations is greater than the threshold (such as 10%), then the packaged DRAM is discarded as bad, step 305.

Partially-good DRAM chips with defects below the test threshold are soldered onto memory module substrates to form memory modules, step 314. These memory modules with partially-good DRAM chips are pre-tested, step 315, using a simple test such as open, shorts, power consumption, some test patterns to locate defects. The defects found are mapped to create a defect map that is programmed into the SPD-EEPROM.

The memory modules are placed into burn-in boards and placed into a burn-in oven, step 306. Burn-in boards, pattern-generators, and the oven shown in FIG. 9 may be used. The burn-in oven stresses the memory modules to cause some early failures. The non-failing memory modules then have a higher reliability. The memory modules are removed from the burn-in oven and from the burn-in board, step 308, after a period of time. The amount of time in the burn-in oven can vary, depending on the desired reliability of the memory modules.

The memory modules are tested more extensively after burn-in, step 318, and the test patterns locate defective memory locations. The defective memory locations are arranged into a defect map that is programmed into the SPD-EEPROM.

The memory modules are then tested on a target-system tester that reads the defect table from the SPD-EEPROM, and re-maps memory accesses for address of defective memory blocks identified by the defect table to spare address locations, step 316. This functional test can be performed on a motherboard-based tester such as the one shown in FIG. 10. The motherboard is modified to have a memory controller, operating system, BIOS, or firmware that reads the defect map from the SPD-EEPROM on the memory module, and then re-directs memory accesses to defective memory locations.

A final environmental test may optionally be performed on the memory modules, step 320. The temperature and voltages may be varied during this test. The memory modules may be binned into different classes based on these tests. When a failure occurs using the defect table, the table may be re-read several times, and then re-programmed if necessary, and step 318 repeated from step 316 or 320.

Figure 6A:
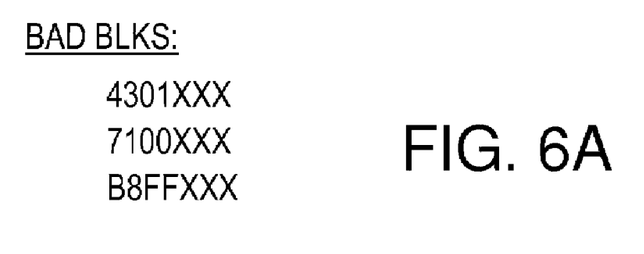
FIGS. 6A-B show two kinds of defect maps that may be stored in the SPD-EEPROM to identify defective memory locations in the partially-good DRAM chips on the memory module.

FIGS. 6A-B show two kinds of defect maps that may be stored in the SPD-EEPROM to identify defective memory locations in the partially-good DRAM chips on the memory module. In FIG. 6A, the addresses of bad blocks are listed in a list. The size of the bad blocks may be fixed, such as 4K blocks, or ranges of bad memory locations could be listed. The bad block locations could be listed in memory order, or could be listed in some other order. The host system could then re-order the list of bad memory blocks into a sequential order.

Figure 6B:
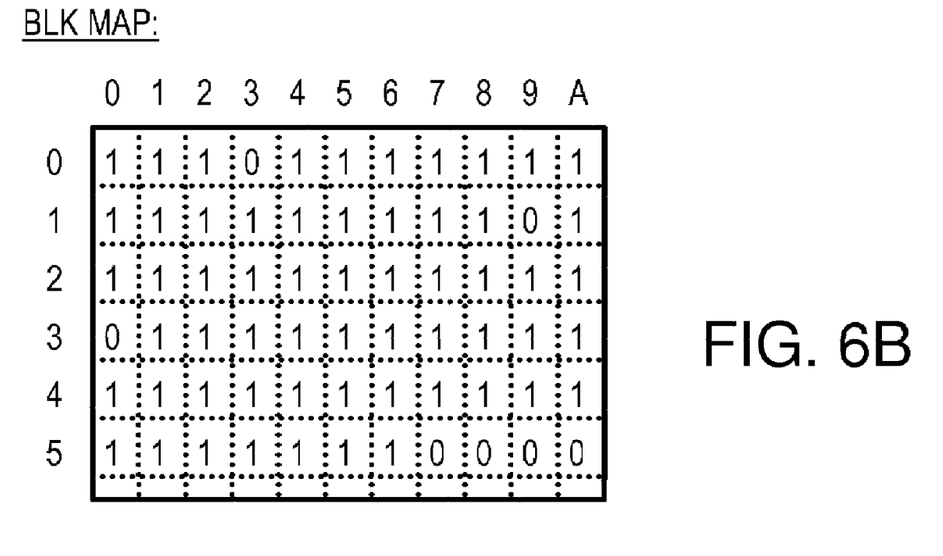

In FIG. 6B, a block map is used as the defect map stored in the SPD-EEPROM. In this alternative, a 2-dimensional map is stored. Each X-Y intersection in the defect map stores one bit that indicates whether the block is good or bad. In this example, a 0 indicates a block that has at least one defective bit, while a 1 indicates a good block with all memory cells good. The host system can copy this defect map from the SPD-EEPROM during initialization or booting, and later perform lookups in its copy of the defect map to determine whether the memory address is to a bad block. When the defect table has a 0 for an address, then the host's memory controller, operating system, BIOS, or firmware re-maps the address to a spare address in a good block.

Figure 7A:
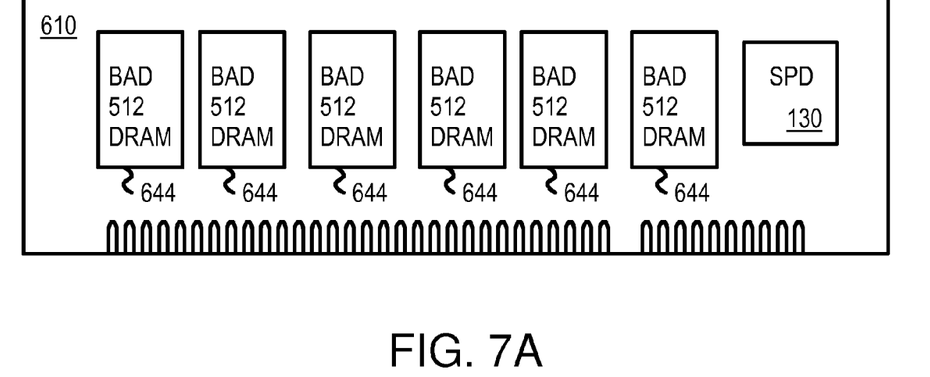
FIGS. 7A-B show memory modules with partially-good DRAM chips.

FIGS. 7A-B show memory modules with partially-good DRAM chips. In FIG. 7A, partially-good DRAM chips 644 are soldered to the substrate of memory module 610 along with SPD-EEPROM 130. Since partially-good DRAM chips 644 have defects, the depth of memory module 610 is reduced.

For example, if partially-good DRAM chips 644 are partially-good from 64M×8 to 32M×8, then memory module 610 can be partially-good from 64M×64 to 32M×64 when memory module 610 has eight partially-good DRAM chips 644 and a 64-bit data bus.

In this embodiment, all DRAM chips soldered to the substrate of memory module 610 are partially-good DRAM chips 644. Trace layout is fairly simple since the address inputs to all DRAM chips are the same. However, bad memory locations are mapped out and stored on SPD-EEPROM 130, and the system does not access these bad locations.

Figure 7B:
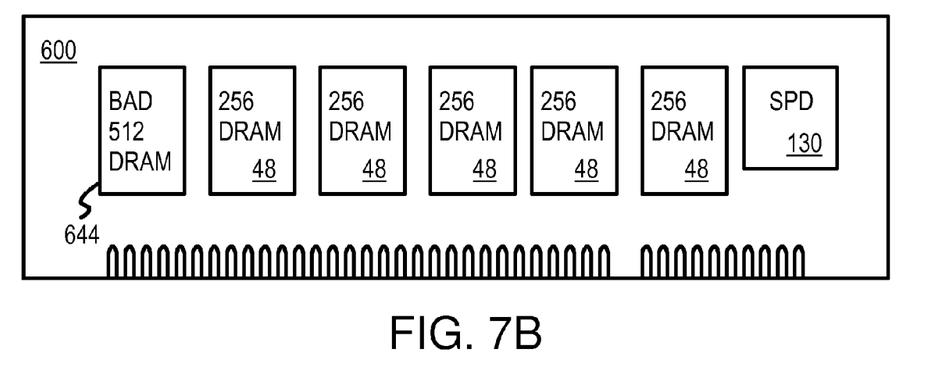

In FIG. 7B, only one of the DRAM chips is a partially-good DRAM chip. Other DRAM chips are good DRAM chips. The partially-good size of partially-good DRAM chip 644 matches the full size of good DRAM chips 48. For example, partially-good DRAM chip 644 may have been partially-good from 512 Mbit to 256 Mbit. Good DRAM chips 48 are also 256 Mbit, and have the same depth and data width as partially-good DRAM chip 644.

Somewhat different trace wiring may be needed for good DRAM chips 48 than for partially-good DRAM chip 644. Mixed-size memory module 600 is useful when few partially-good DRAM chips 644 are available, such as for small factories or very high yields of DRAM chips.

Figure 8:
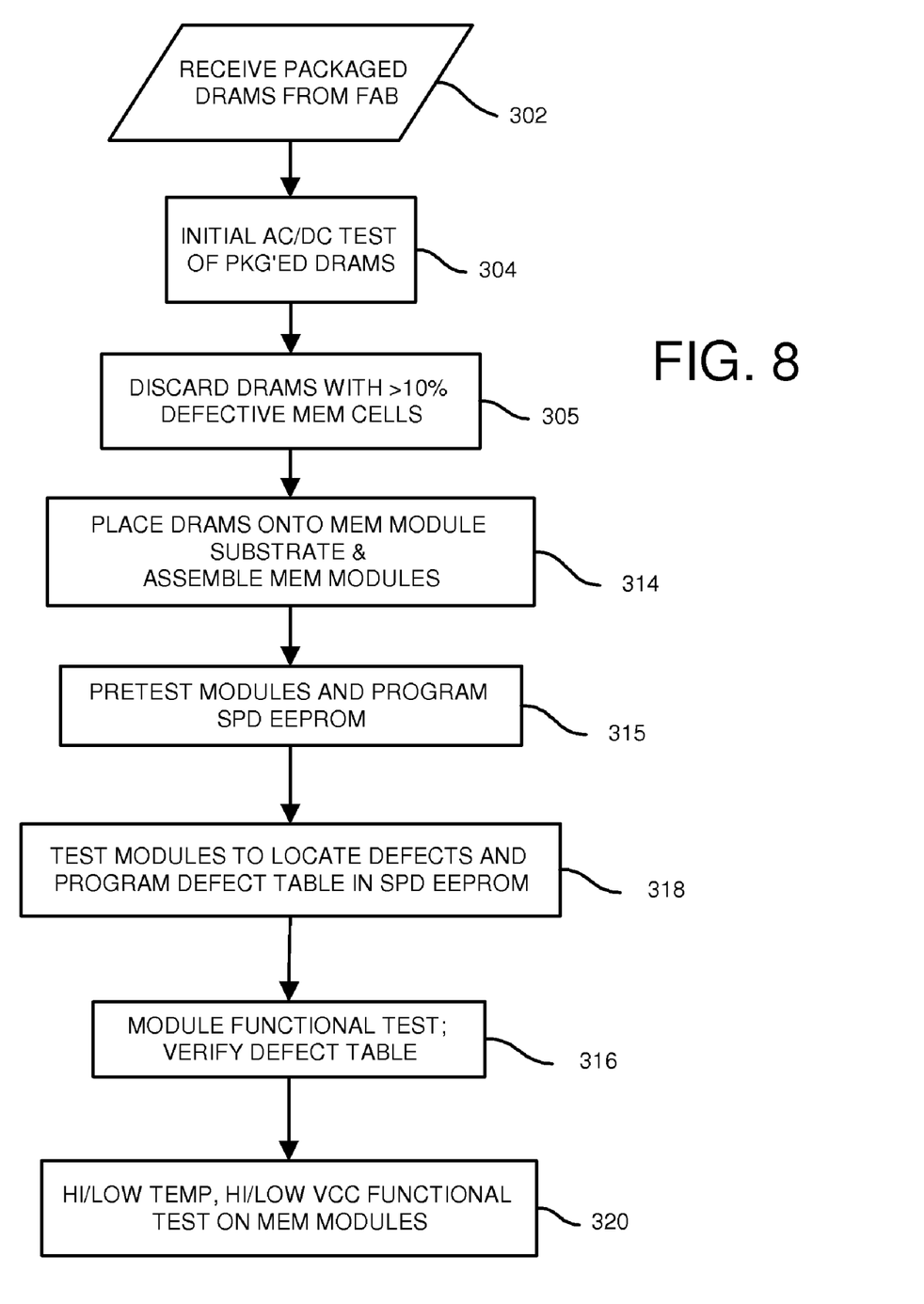

FIG. 8 shows a flowchart of a simplified manufacturing process that uses partially-good DRAM chips without burn-in. The burn-in steps of FIG. 5 are deleted to reduce manufacturing costs. The reliability of the finished memory modules is reduced.

Partially-good DRAM chips are received from a wafer fab or foundry, step 302. These partially-good DRAM chips may have been initially tested at the wafer fab by a wafer-sort machine to mark and discard grossly bad die, or may be blindly packaged. The packaged partially-good DRAM chips are tested by the memory module manufacturer or a contractor during an incoming AC/DC test, step 304. This incoming test includes DC tests such as opens, shorts, and power consumed, and also performs simple AC testing with a few test patterns.

In a typical AC test, the test is halted at the first failure. However, the AC test in step 304 continues when a defective memory location is found, and keeps a tally of the number of defective memory locations. Once the test pattern is done, the number of defective memory locations is compared to a test threshold, such as 10%. When the number of defective memory locations is greater than the threshold (such as 10%), then the packaged DRAM is discarded as bad, step 305.

Partially-good DRAM chips with defects below the test threshold are soldered onto memory module substrates to form memory modules, step 314. These memory modules with partially-good DRAM chips are pre-tested, step 315, using a simple test such as open, shorts, power consumption, some test patterns to locate defects. The defects found are mapped to create a defect map that is programmed into the SPD-EEPROM.

The memory modules are tested more extensively, step 318, and the test patterns locate defective memory locations. The defective memory locations are arranged into a defect map that is programmed into the SPD-EEPROM.

The memory modules are then tested on a target-system tester that reads the defect table from the SPD-EEPROM, and re-maps memory accesses for address of defective memory blocks identified by the defect table to spare address locations, step 316. This functional test can be performed on a motherboard-based tester such as the one shown in FIG. 10. The motherboard is modified to have a memory controller, operating system, BIOS, or firmware that reads the defect map from the SPD-EEPROM on the memory module, and then re-directs memory accesses to defective memory locations.

A final environmental test may optionally be performed on the memory modules, step 320. The temperature and voltages may be varied during this test. The memory modules may be binned into different classes based on these tests.

Figure 9:
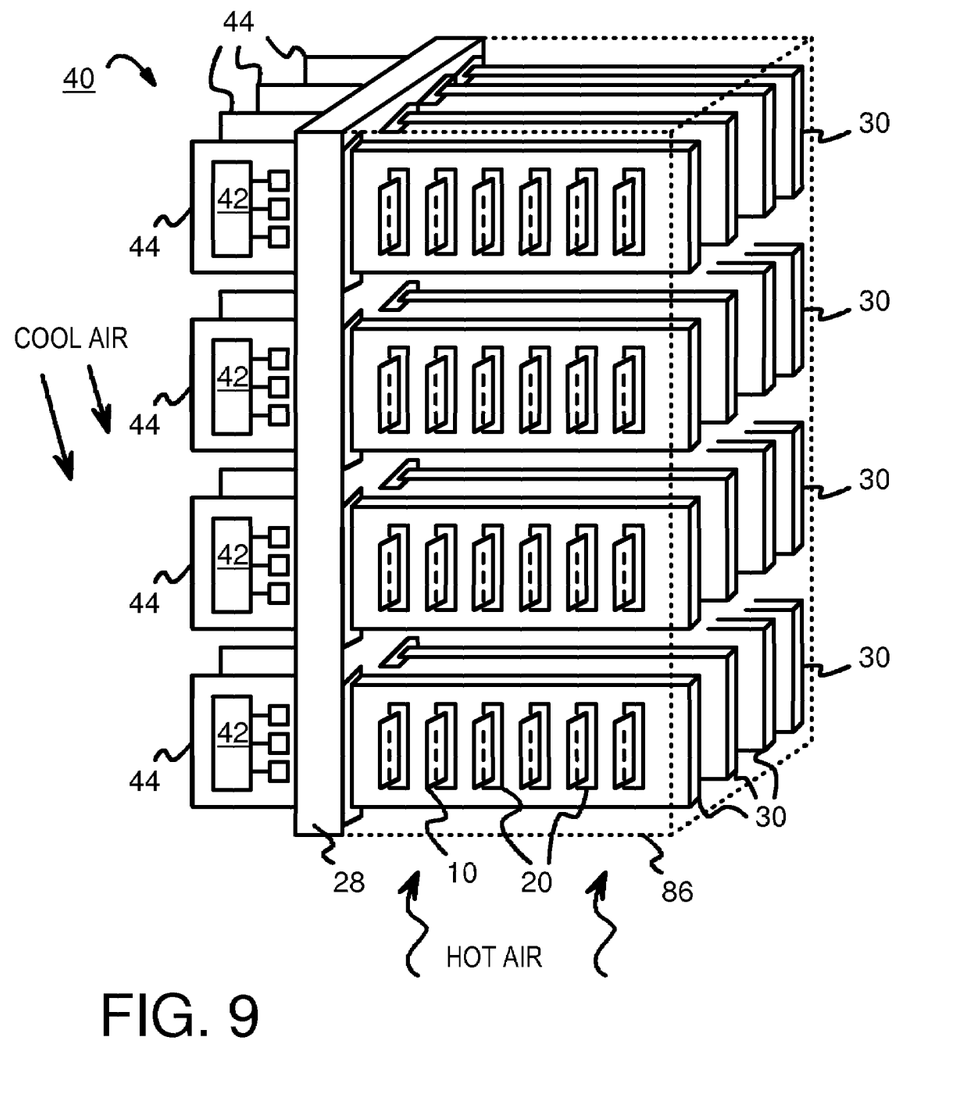
FIG. 9 is a perspective view of a memory module burn-in chamber/tester.

Memory-Module Burn-In Chamber—FIG. 9

FIG. 9 is a perspective view of a memory module burn-in chamber/tester. Burn-in chambers that accept memory modules plugged into memory-module burn-in boards may be used as burn-in oven 114 of FIG. 4. For example, a memory-module burn-in chamber that also performs some testing of memory modules while inside the burn-in oven is described in U.S. Pat. No. 6,910,162. Hot air can be blown into the bottom or sides of heat chamber 86, rising past module motherboards 30 to raise the temperature of memory modules 10 inserted into memory-module sockets 20. Module motherboards 30 may correspond to memory-module burn-in boards 116 of FIG. 4.

Backplane 28 provides electrical connection from each pattern-generator card 44 to each module motherboard 30, and also provides some thermal insulation. A layer of foam insulation may be attached to backplane 28 and to the sides of heat chamber 86. Pattern-generator cards 44 are kept cooler than module motherboards 30 because back area 40 is separated from heat chamber 86 by backplane 28.

Cool air can be blown across pattern-generator cards 44 while hot air is blown through the heat chamber across module motherboards 30. Pattern generators 42 on pattern-generator cards 44 can be kept cooler than memory modules 10, allowing for longer life and better current drive of pattern generator 42.

Backplane 28, pattern-generator cards 44, and module motherboards 30 can be mounted on a rack that is enclosed by heat chamber 86. Several racks can be mounted on top of each other, or beside one another in a larger burn-in unit enclosure. Hot air can be blown in from the bottom or sides of the unit. Local heaters, thermocouples, or other temperature-sensors can also be used to better regulate and control heating. The unit could be turned, rotated, flipped, or otherwise re-oriented. Cooling, humidity, or other environmental testing could also be performed.

Backplane 28 can route power and ground to all pattern-generator cards 44 and all module motherboards 30. Monitoring and control signals can also be routed through backplane 28, such as reset signals to pattern generators 42 or result or status data from pattern generator 42 to a central controller or network interface to a host.

Figure 10:
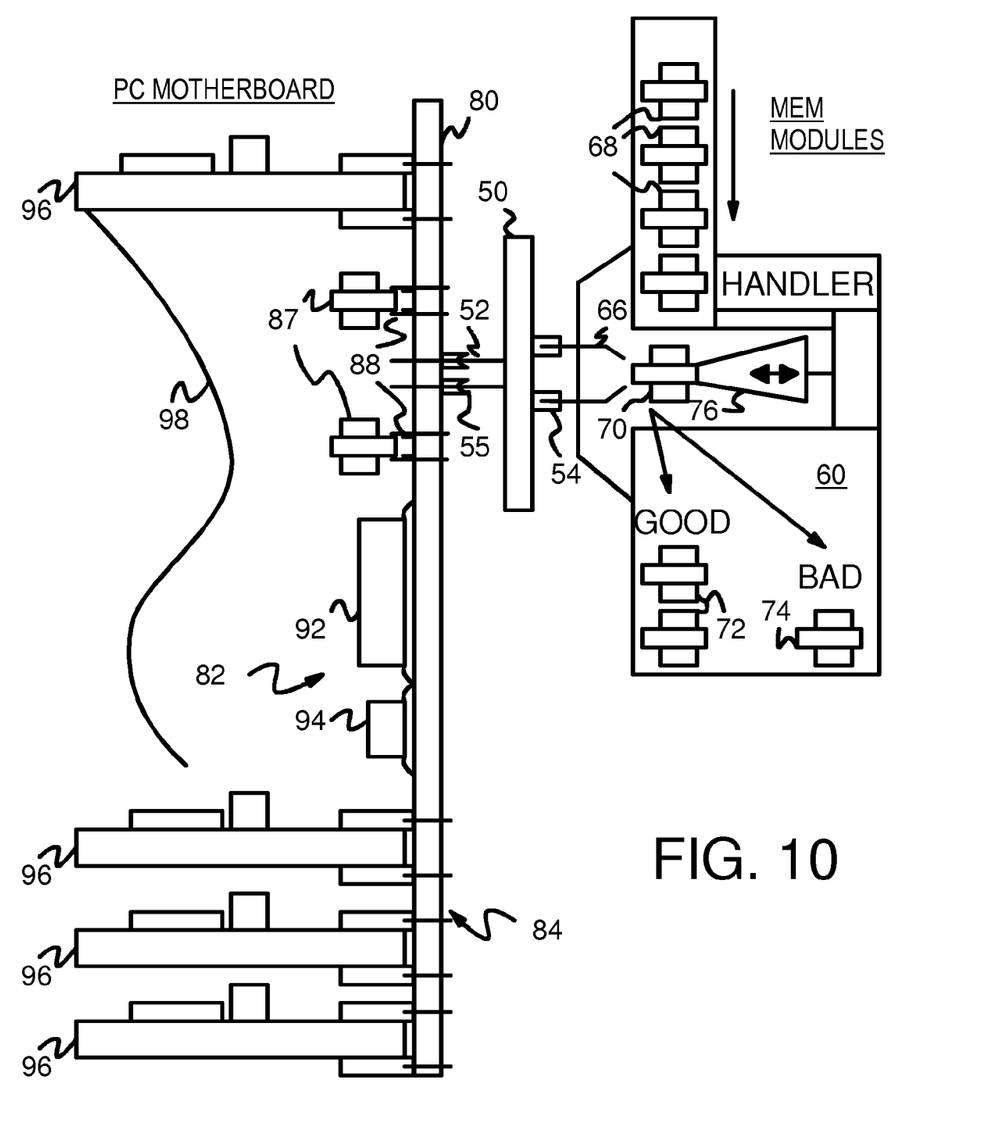
FIG. 10 shows a memory-module tester that is constructed from a personal computer PC motherboard.

PC-Based Memory-Module Tester—FIG. 10

After memory modules are removed from memory-module burn-in boards when burn-in is completed, extensive functional tests are performed on the module. FIG. 10 shows a memory-module tester that is constructed from a personal computer PC motherboard. See for example U.S. Pat. Nos. 6,357,022, 6,351,827, and 6,742,144.

While memory modules could be manually inserted into a memory module test socket on the tester, a memory-module handler that automates insertion and removal of memory modules is desirable. Handler 60 is mounted close to the backside of the PC motherboard using handler adaptor board 50. Handler 60 is not drawn to scale since it is several times larger than a PC motherboard.

Handler 60 is mounted by reverse attachment to the solder-side of the PC motherboard rather than to the component-side of the PC motherboard. The memory module socket on the component side of the PC motherboard is removed, and handler adapter board 50 is plugged from the backside into the holes on the PC motherboard for the memory module socket. Handler adapter board 50 is a small epoxy-glass circuit board designed to interface a handler to a PC motherboard.

Contactor pins 66 within handler 60 clamp down onto leadless pads on the edge of module-under-test MUT 70 when arm 76 pushes MUT 70 into place for testing. Contactor pins 66 include enough pins for all power, ground, and I/O leads on MUT 70.

Contactor pins 66 are electrically connected to connectors on the backside of handler 60. These connectors are edge-type connectors that normally connect with high-speed testers. Typically two connectors are provided. These male-type connectors fit into female-type connectors 54 mounted on handler adaptor board 50. Handler adaptor board 50 contains metal wiring traces formed therein that route signals from connectors 54 to adaptor pins 52 that protrude out the other side of handler adaptor board 50.

Adaptor pins 52 can be directly soldered to PC motherboard substrate 80 using the holes exposed when the memory-module socket was removed, or adaptor pins 52 can be plugged into female pins 55 that are soldered onto solder-side 84 of the PC motherboard. Female pins 55 have extensions that fit into the through-holes exposed by removal of the SIMM socket, but also have cup-like receptacles for receiving adaptor pins 52. Using female pins 55 allows handler adaptor board 50 to be easily removed from substrate 80.

Once MUT 70 has been tested by a test program running on the PC motherboard, MUT 70 is sorted and drops down into either good bin 72 or bad bin 74. Sorting is in response to a pass/fail signal from the test program running on the PC motherboard.

Substrate 80 of the PC motherboard is a conventional multi-layer epoxy-fiberglass circuit board. Components 92, 94 are mounted on component-side 82 of substrate 80. Memory modules 87 fit into memory module sockets 88 that have metal pins that fit through holes in substrate 80. These pins are soldered to solder-side 84 of substrate 80 to rigidly attach sockets to the PC motherboard. Expansion cards 96 are plugged into expansion sockets that are also mounted onto component-side 82 of substrate 80. Cables 98 that are plugged into expansion cards 96 connect peripherals such as disk drives, video display monitors, and multimedia devices to the PC.

Since the memory module tester is constructed from an inexpensive PC motherboard, the cost of the tester is several orders of magnitude smaller than the cost of a million-dollar automated-test-equipment (ATE) machine. Thus test costs are significantly reduced by using a PC-motherboard-based tester. Many different test patterns may be applied to the memory module under test, and the voltages and temperature may be varied to perform corner testing. Hot or cold air may be blown onto the memory module under test by a nozzle (not shown), while the voltage applied to the memory module under test may be adjusted by handler adaptor board 50 or by the PC motherboard.

Figure 11:
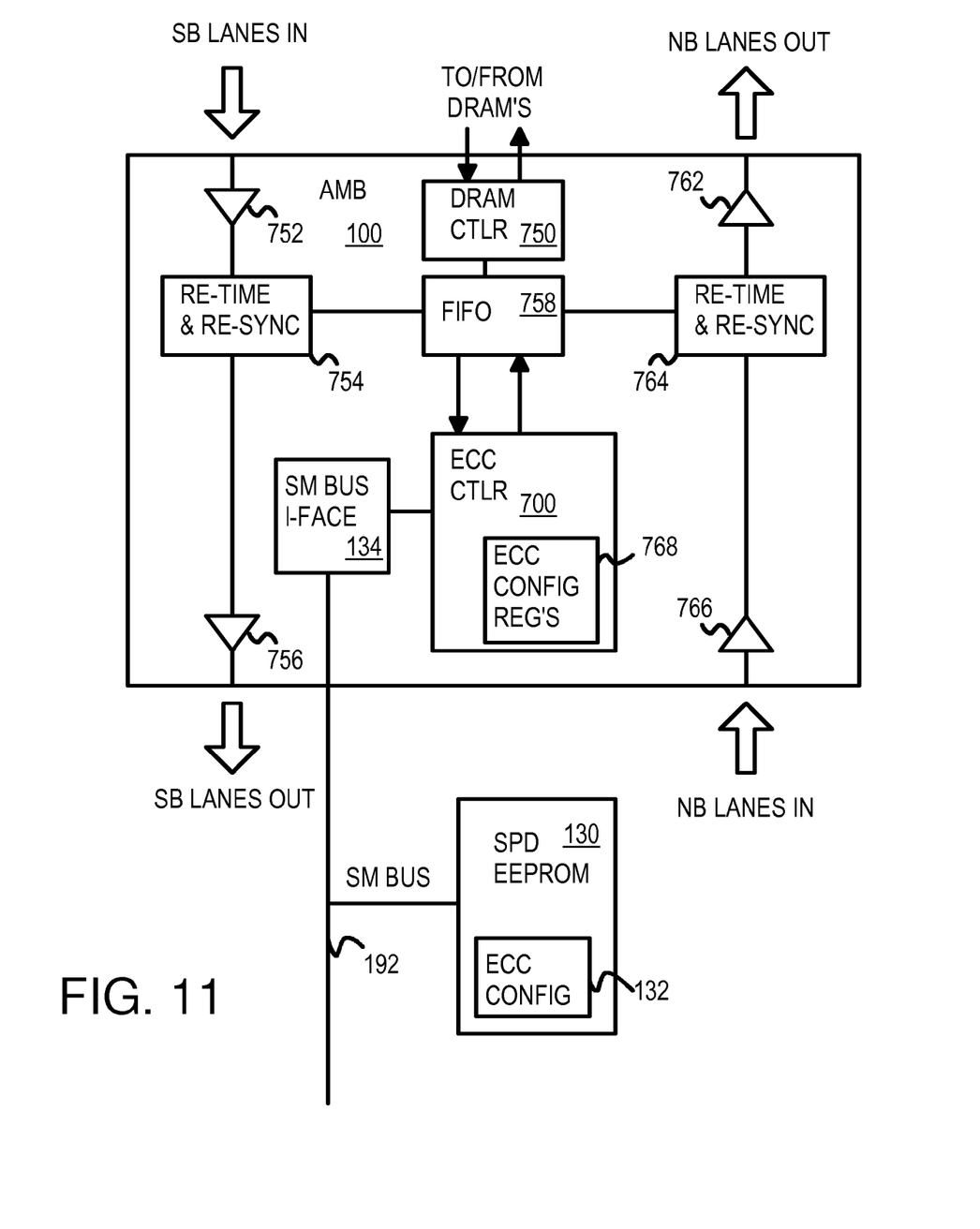
FIG. 11 shows an error-correcting AMB that has its configuration programmed from a serial-presence-detect electrically-erasable programmable read-only memory (SPD-EEPROM) on the memory module.

FIG. 11 shows an error-correcting AMB that has its configuration programmed from a serial-presence-detect electrically-erasable programmable read-only memory (SPD-EEPROM) on the memory module. Many memory modules contain SPD-EEPROM 130. SPD-EEPROM 130 stores configuration information for the memory module, such as speed, depth, and arrangement of the memory on the memory module. In addition, SPD-EEPROM 130 is extended to store a defect map that indicates where defects are located within the memory space of the memory module.

During initialization, the host processor reads the configuration from SPD-EEPROM 130 over SM bus 192 as serial data. The defect map is also read from SPD-EEPROM 130 and loaded into the host's memory controller, operating system, BIOS, or firmware which re-maps memory accesses to defective locations indicated by the defect map to other memory locations that are not defective.

SPD-EEPROM 130 also stores ECC configuration for ECC controller 700 on the memory module. During manufacture, a desired ECC configuration is written as error-correction configuration 132 in SPD-EEPROM 130. Each time that the memory module is powered up or re-initialized, error-correction configuration 132 is transferred to error-correction configuration registers 768. SM-bus interface 134 reads error-correction configuration 132 from SPD-EEPROM 130 over SM bus 192.

Error-correcting AMB 100 contains DRAM controller 750. DRAM controller 750 generates DRAM control signals to read and write data to and from DRAM chips 22 on memory module 10 (FIG. 1). Data is temporarily stored in FIFO 758 during transfers. The data from FIFO 758 is encapsulated in frames that are sent over differential lines in metal contact pads 12. Re-timing and re-synchronizing buffers 754 restore the timing of the differential signals received by input buffers 752 prior to retransmission. Input buffers 752 and output buffers 756 contain differential receivers and transmitters for the southbound lanes that are buffered by re-timing and re-synchronizing buffers 754.

Frames that are destined for the current memory module are copied into FIFO 758 and processed by error-correcting AMB 100. For example, for a write frame, the data from FIFO 758 is written to DRAM chips 22 on the memory module by error-correcting AMB 100. For a read, the data read from DRAM chips 22 is stored in FIFO 758. Error-correcting AMB 100 forms a frame and sends the frame to northbound re-timing and re-synchronizing buffers 764 and out over the northbound lanes from differential output buffer 762. Input buffers 766 and output buffers 762 contain differential receivers and transmitters for the northbound lanes that are buffered by re-timing and re-synchronizing buffers 764.

When ECC controller 700 is enabled, ECC controller 700 examines write-data in FIFO 758 before the data is written to the memory chips by DRAM controller 750. ECC controller 700 generates ECC bits for the write-data and writes these generated ECC bits to FIFO 758 or to another memory (not shown), or sends the ECC bits to DRAM controller 750 so the ECC bits can be written to the memory chips by DRAM controller 750.

When data is read from the memory chips by DRAM controller 750, the stored ECC bits are also read from the memory chips by DRAM controller 750. The read-data and the ECC bits are sent from DRAM controller 750 to ECC controller 700 so that ECC controller 700 can generate the syndrome and check for errors. Error correction may be attempted, and if successful, corrected data is written to FIFO 758 by ECC controller 700.

Alternately, DRAM controller 750 may write both the read-data and the ECC bits into FIFO 758. Then ECC controller 700 reads the read-data and the ECC bits from FIFO 758, and performs checking and correction. DRAM controller 750 and ECC controller 700 may be pipelined to operate on data at different times.

ALTERNATE EMBODIMENTS

Several other embodiments are contemplated by the inventors. For example, the size of the memory block in the defect table can be 1 K bits, 4K, 256, or some other value. While quadrants have been described, smaller divisions of the memory could be tested and combined for downgrading. While a half-size downgrade has been described, higher reduction ratios could be used, such as a downgrade from S words to S/4 words, or from S words to S/8 words. The quadrants, divisions, or blocks do not have to match physical divisions inside the DRAM chips, but can be logical divisions.

Although marking of DRAM chips has been described, such as printing a part number or size on a package, marking is not necessary. DRAM chips can be sorted by the tester or handling equipment controlled by the test results into separate bins. The separately binned chips may be directly soldered to memory module substrates without any chip marking by carefully keeping track of the separate bins.

The exact test threshold may vary from 10%, such as 5%, 1%, 20%, etc. The test threshold may be expressed as a number of allowable failures in a test sequence rather than a percentage of memory cells.

Memory modules that fail functional testing may be re-worked and possibly repaired, such as by replacing a defective DRAM chip or re-soldering a loose connection. A small percentage of the modules, such as 1%, may need to be reworked. However, sometimes the yield of DRAM chips from the wafer fab is low, and failures are more common. A yield-sampling method may be used as an alternative to detect low-yield batches of DRAM chips that may occasionally be received. The sampling method also detects problems with the packaging process.

SPD-EEPROM 130 could be integrated into an Advanced Memory Buffer (AMB) or another buffer chip. Remapping logic could then be integrated with the AMB or buffer chip. SPD-EEPROM 130 may not be present on some types of memory modules. The invention could be applied to unbuffered memory modules, buffered memory modules, Fully-Buffered Dual-Inline Memory Module (FB-DIMM) memory modules, and other kinds of memory modules, including memory modules using future standards.

While DRAM has been described, other kinds of memory could be substituted, such as SRAM, non-volatile memory, or other kinds of memory. The invention may be combined with chip-level redundancy and repair that the DRAM manufacturer performs. Built-in-self-test (BIST) could be used for testing.

Different control signals may be used. Traces may be formed from metal traces on surfaces of the memory module, or on interior traces on interior layers of a multi-layer PCB. Vias, wire jumpers, or other connections may form part of the electrical path. Resistors, capacitors, or more complex filters and other components could be added. For example, power-to-ground bypass capacitors could be added to the memory module.

Muxes and switches could be added to allow for loop-back testing as well as standard operation. Future memory module standards and extensions of the memory module standard could benefit from the invention.

Some test flows may use a multi-target jump or conditional statement in a test program rather than separate steps as shown for illustration. The steps may be rearranged in various ways, and additional steps may be added. The initial pre-screening of partially-good DRAM chips may be skipped, and burn-in may be skipped.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A manufacturing method for making partially-good memory modules from partially-good memory chips comprising:

receiving partially-tested memory chips, wherein the partially-tested memory chips are packaged dice that have not been fully tested to detect all defects;

pre-testing the partially-tested memory chips by applying initial test patterns to the partially-tested memory chips;

wherein the initial test patterns test for defective memory blocks;

counting a number of defective memory blocks found during pre-testing with the initial test patterns;

discarding memory chips that have a number of defective memory blocks found during pre-testing that is more than a test threshold;

passing memory chips as partially-good memory chips that have a number of defective memory blocks found during pre-testing that is less than the test threshold;

for the partially-good memory chips, soldering the partially-good memory chips onto a memory module substrate to form a partially-good memory module;

soldering a non-volatile memory chip onto the partially-good memory module;

testing the partially-good memory module using module test patterns to locate defective memory locations;

creating a defect map that represents the defective memory locations found by the module test patterns in the partially-good memory module;

programming the defect map into the non-volatile memory chip to form a programmed partially-good memory module;

inserting the programmed partially-good memory module into a module test socket on a target test system; and target-system testing the programmed partially-good memory module by initially copying the defect map from the non-volatile memory chip to the target test system, and executing a test program on the target test system, the test program generating memory accesses to the programmed partially-good memory module, the target test system redirecting memory accesses for the defective memory locations identified by the defect map, whereby partially-good memory chips are formed into the partially-good memory modules for use on target systems that read the defect map from the non-volatile memory chip on the partially-good memory module.

2. The manufacturing method of claim 1 wherein initially copying the defect map from the non-volatile memory chip to the target test system comprises re-booting the target test system and executing boot code on the target test system that reads the defect map from the non-volatile memory chip, whereby the target test system reads the defect map during rebooting.

3. The manufacturing method of claim 1 wherein discarding memory chips that have the number of defective memory blocks found during pre-testing that is more than the test threshold comprises:

discarding memory chips that have more than 10% of memory blocks being defective memory blocks, wherein the test threshold corresponds to 10% of a total number of memory blocks on a memory chip;

wherein the memory blocks each comprise multiple memory cells.

4. The manufacturing method of claim 1 wherein initially copying the defect map from the non-volatile memory chip to the target test system comprises reading a serial data stream from the non-volatile memory chip, whereby the non-volatile memory chip is a serial memory.

5. The manufacturing method of claim 4 wherein the non-volatile memory chip is a serial-presence-detect-electrically-erasable programmable read-only memory (SPD-EEPROM).

6. The manufacturing method of claim 1 wherein the partially-good memory chips are dynamic-random-access memory (DRAM).

7. The manufacturing method of claim 1 further comprising:

inserting the programmed partially-good memory module into a module socket on a memory-module burn-in board;

placing the memory-module burn-in boards into a burn-in oven;

stressing the programmed partially-good memory module and the partially-good memory chips soldered to the memory module substrate of the programmed partially-good memory module by heating the programmed partially-good memory module in the burn-in oven for a burn-in period of time;

removing the memory-module burn-in boards from the burn-in oven after the burn-in period of time and extracting the programmed partially-good memory module from the memory-module burn-in boards as a burned-in memory module; and fully testing the burned-in memory module by applying extensive test patterns to the burned-in memory module;

wherein the extensive test patterns test for possible defects that were not detected in the partially-good memory chips;

whereby partially-good memory chips are soldered into programmed partially-good memory module that is burned-in and fully tested.

8. The manufacturing method of claim 7 further comprising:

environmental testing the burned-in memory module by applying elevated temperature and voltage conditions to the burned-in memory module while applying extensive test patterns to the burned-in memory module, whereby memory modules are environmentally tested.

9. The manufacturing method of claim 8 further comprising:

voltage stressing the programmed partially-good memory module during the burn-in period of time while being heated in the burn-in oven by applying elevated voltages to inputs of the programmed partially-good memory module;

applying test-pattern inputs to the programmed partially-good memory module while in the burn-in oven;

wherein the programmed partially-good memory module are further stressed by test-pattern inputs that exercise the partially-good memory chips on the programmed partially-good memory module.

10. The manufacturing method of claim 7 wherein fully testing the burned-in memory modules comprises:

inserting the burned-in memory modules into a test socket that electrically connects to a memory bus on an adapted personal computer motherboard of the target test system;

running a test program on the adapted personal computer motherboard that writes and reads through the memory bus and test socket to memory locations on the partially-good memory chips soldered on the burned-in memory modules;

whereby the burned-in memory modules are tested using the adapted personal computer motherboard.

11. The manufacturing method of claim 10 wherein pre-testing the partially-tested memory chips by applying initial test patterns to the partially-tested memory chips further comprises:

performing an initial screen test on the partially-tested memory chips by inserting the partially-tested memory chips into an automated-test-equipment (ATE) tester, wherein a cost of the ATE tester is at least 10 times more than the cost of the adapted personal computer motherboard that tests the burned-in memory modules, whereby an inexpensive tester is used for testing memory modules.

12. The manufacturing method of claim 7 further comprising:

reworking memory modules that fail extensive test patterns applied while fully testing the burned-in memory modules, wherein reworking memory modules comprises replacing a defective partially-good memory chip on a memory module with another partially-good memory chip to generate an assembled memory module, whereby defective partially-good memory chips are replaced during reworking.

13. The manufacturing method of claim 1 further comprising:

sampling the partially-tested memory chips by selecting a sample of the partially-tested memory chips;

fully testing the sample of the partially-tested memory chips and generating a yield that indicates a fraction of the sample that failed;

comparing the yield to a yield threshold;

when the yield is below the yield threshold, fully testing all partially-tested memory chips in a batch before soldering the partially-tested memory chips to the memory module substrate;

when the yield is above the yield threshold, soldering the partially-tested memory chips to the memory module substrate without full testing of remaining partially-tested memory chips in the batch, whereby batches of the partially-tested memory chips are sampled to determine when the yield is below the yield threshold.

14. A partially-good memory module made by the manufacturing method of claim 1.

15. A method for producing partially-good memory modules comprising:
- soldering memory chips having defective memory blocks to a substrate and soldering a non-volatile memory chip to the substrate to assemble a memory module;
- wherein memory chips are soldered to the substrate before being fully tested and before being burned-in;
- locating defective memory locations by functionally testing the memory module by applying test patterns that write and read all accessible memory locations on the memory chips in the memory module;
- creating a defect table that identifies the defective memory locations;
- programming the defect table into the non-volatile memory chip; and
- target testing the memory module by inserting the memory module into a module test socket on a target system, the target system reading the defect table from the non-volatile memory chip and applying test patterns that write and read all non-defective memory locations on the memory chips in the memory module, wherein the non-defective memory locations are memory locations not identified by the defect table.

16. The method for producing partially-good memory modules of claim 15 further comprising:
- burning in the memory module before target testing by:
- inserting the memory module into a socket on a memory-module burn-in board;
- inserting the memory-module burn-in board into a burn-in oven;
- stressing the memory module on the memory-module burn-in board in the burn-in oven by applying elevated temperature and voltage; and
- removing the memory-module burn-in board from the burn-in oven and removing the memory module from the memory-module burn-in board.

17. The method for producing partially-good memory modules of claim 16 further comprising initially screening the memory chips before soldering to the substrate by:
- applying initial test patterns that write and read memory locations on the memory chips;
- counting a number of failures during application of the initial test patterns;
- discarding memory chips having a number of failures over a test threshold.

18. The method for producing partially-good memory modules of claim 17 wherein the test threshold comprises more than one defect and less than 10% of all memory locations on the memory chip.

19. The method for producing partially-good memory modules of claim 18 wherein target testing comprises heating the memory module to an elevated temperature and applying a reduced power-supply voltage below a standard power-supply voltage when test patterns are applied.

20. The method for producing partially-good memory modules of claim 19 further comprising:
- selecting a sample of the memory chips;
- testing the sample of the memory chips using sample test patterns that are able to detect more defects than initial test patterns used when partially testing the memory chips to initially screen out defective memory chips having open or shorted pins;
- determining a yield for the sample that depends on a number of failing memory chips; and
- comparing the yield to a target to determine when to test remaining memory chips in a lot containing the sample with the sample test patterns, and when to test remaining memory chips with just the initial test patterns,
- whereby yield of the memory chips is sampled.

* * * * *